US012131996B2

(12) United States Patent
Park et al.

(10) Patent No.: US 12,131,996 B2
(45) Date of Patent: Oct. 29, 2024

(54) STACKED DEVICE WITH BACKSIDE POWER DISTRIBUTION NETWORK AND METHOD OF MANUFACTURING THE SAME

(71) Applicant: Samsung Electronics Co., Ltd., Suwon-si (KR)

(72) Inventors: Saehan Park, Clifton Park, NY (US); Seungyoung Lee, Clifton Park, NY (US); Inchan Hwang, Schenectady, NY (US)

(73) Assignee: Samsung Electronics Co., Ltd., Yongin-si (KR)

( * ) Notice: Subject to any disclaimer, the term of this patent is extended or adjusted under 35 U.S.C. 154(b) by 26 days.

(21) Appl. No.: 17/739,717

(22) Filed: May 9, 2022

(65) Prior Publication Data
US 2023/0307364 A1    Sep. 28, 2023

Related U.S. Application Data

(60) Provisional application No. 63/324,558, filed on Mar. 28, 2022.

(51) Int. Cl.
*H01L 23/528*   (2006.01)
*H01L 21/78*    (2006.01)
*H01L 21/822*   (2006.01)
*H01L 21/8238*  (2006.01)
*H01L 27/092*   (2006.01)

(52) U.S. Cl.
CPC ...... *H01L 23/5286* (2013.01); *H01L 21/7806* (2013.01); *H01L 21/8221* (2013.01); *H01L 21/823871* (2013.01); *H01L 27/0922* (2013.01)

(58) Field of Classification Search
CPC ......... H01L 21/8221; H01L 21/823871; H01L 27/0688; H01L 27/0922; H01L 23/5286
See application file for complete search history.

(56) References Cited

U.S. PATENT DOCUMENTS

| 10,420,171 | B2 | 9/2019 | Goktepeli |
| 10,985,064 | B2 | 4/2021 | Zhang et al. |
| 2020/0135718 | A1 | 4/2020 | Liebmann et al. |
| 2020/0381430 | A1 | 12/2020 | Liebmann et al. |
| 2021/0098500 | A1 | 4/2021 | Wang et al. |
| 2021/0134802 | A1 | 5/2021 | Gomes et al. |
| 2021/0242125 | A1 | 8/2021 | Do |

(Continued)

OTHER PUBLICATIONS

European Search Report for EP Application No. 23161784.6 dated Jul. 31, 2023, 7 pages.

*Primary Examiner* — Robert G Bachner
*Assistant Examiner* — Molly K Reida
(74) *Attorney, Agent, or Firm* — Lewis Roca Rothgerber Christie LLP

(57) ABSTRACT

A semiconductor device including a wafer, a first semiconductor device and a second semiconductor device on a front side of the wafer, power rails on a back side of the wafer, a backside power distribution network (PDN) grid on the back side of the wafer, and front-side signal routing lines above the first and second semiconductor devices on the front side of the wafer. The second semiconductor device is stacked on the first semiconductor device, the backside PDN grid is coupled to the power rails, and the power rails are coupled to the first and second semiconductor devices.

7 Claims, 14 Drawing Sheets

(56) References Cited

U.S. PATENT DOCUMENTS

| | | |
|---|---|---|
| 2021/0343715 A1 | 11/2021 | Wu et al. |
| 2021/0366907 A1 | 11/2021 | Liao et al. |
| 2021/0384106 A1* | 12/2021 | Do .................... H01L 27/0688 |
| 2022/0122971 A1* | 4/2022 | Peng .................. H01L 23/5225 |
| 2022/0181258 A1* | 6/2022 | Liebmann ......... H01L 29/66742 |

* cited by examiner

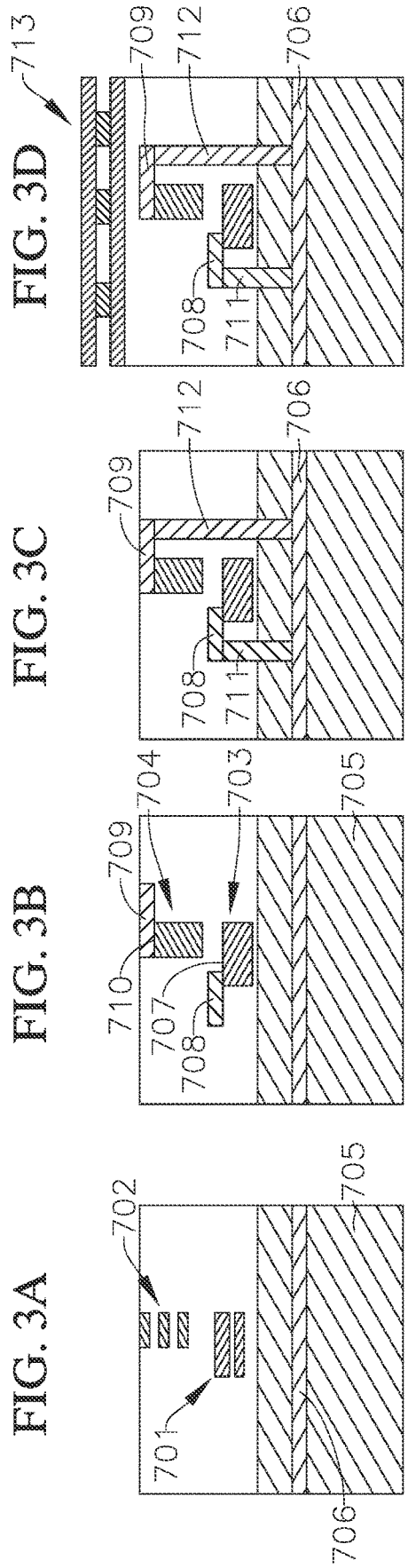

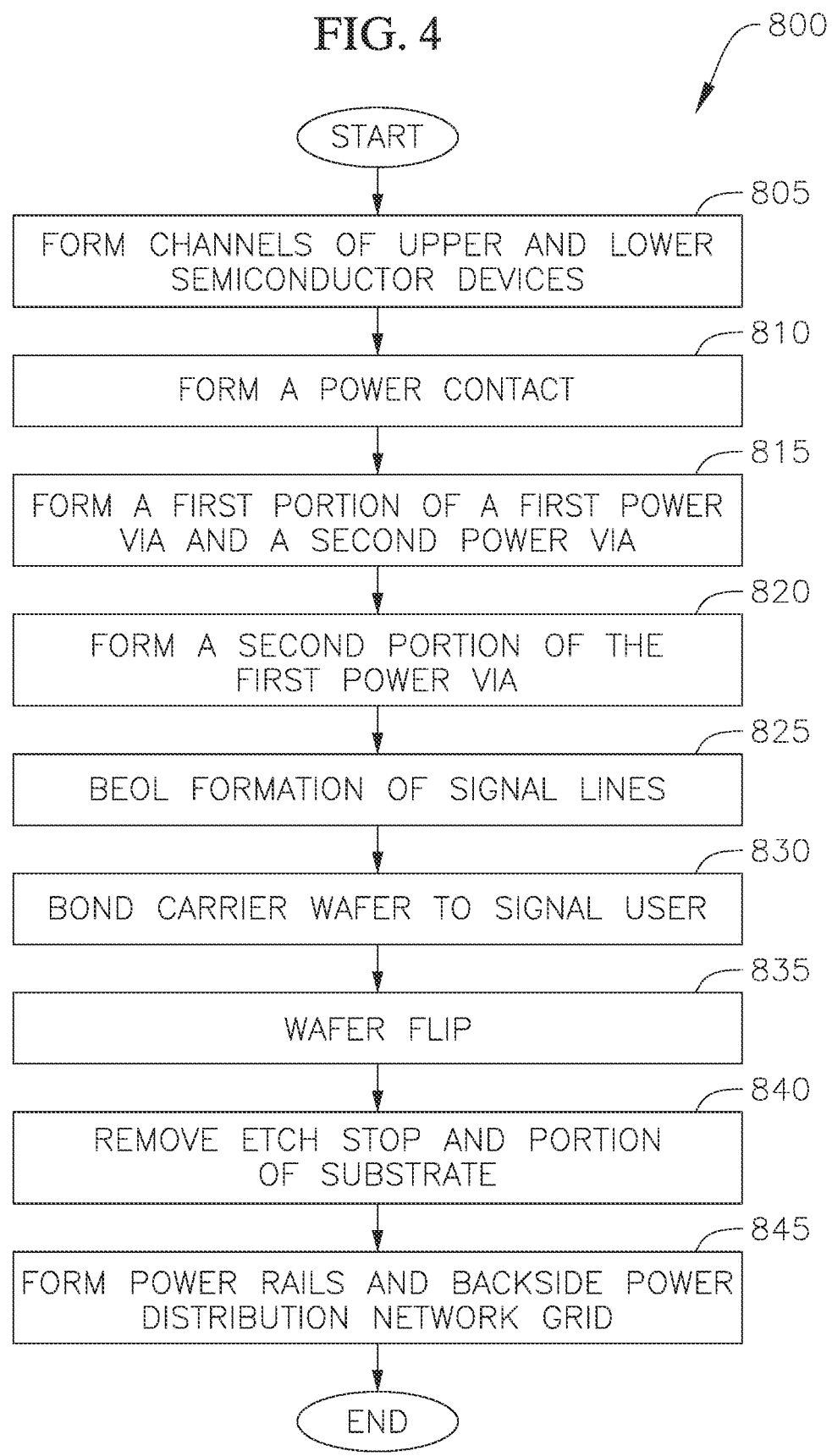

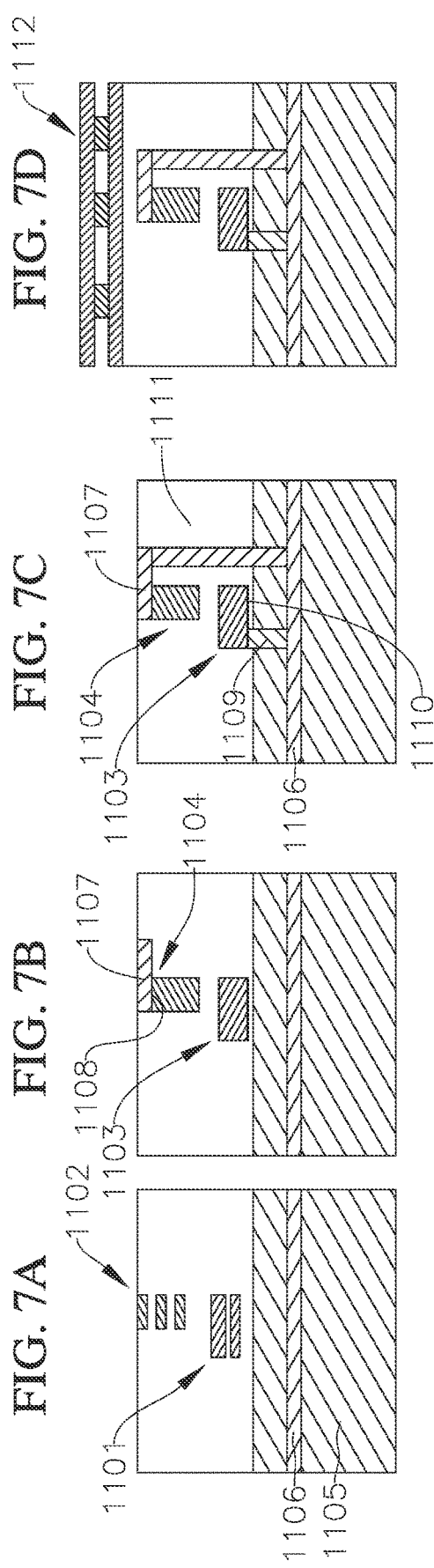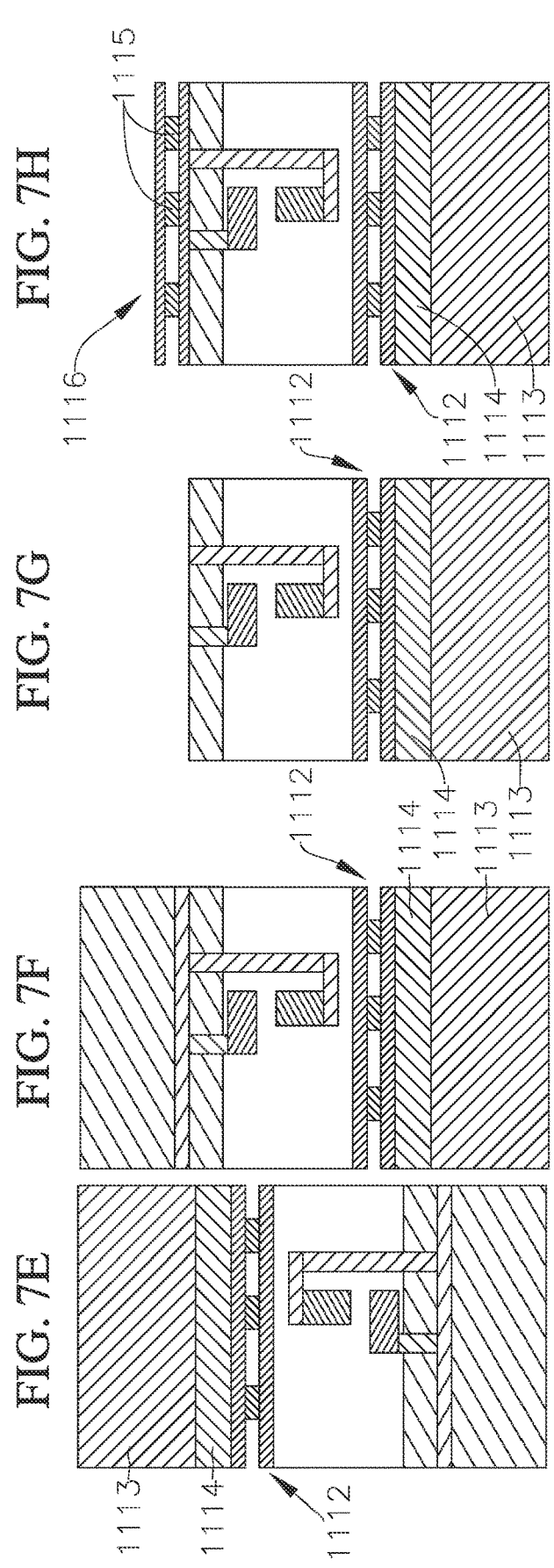

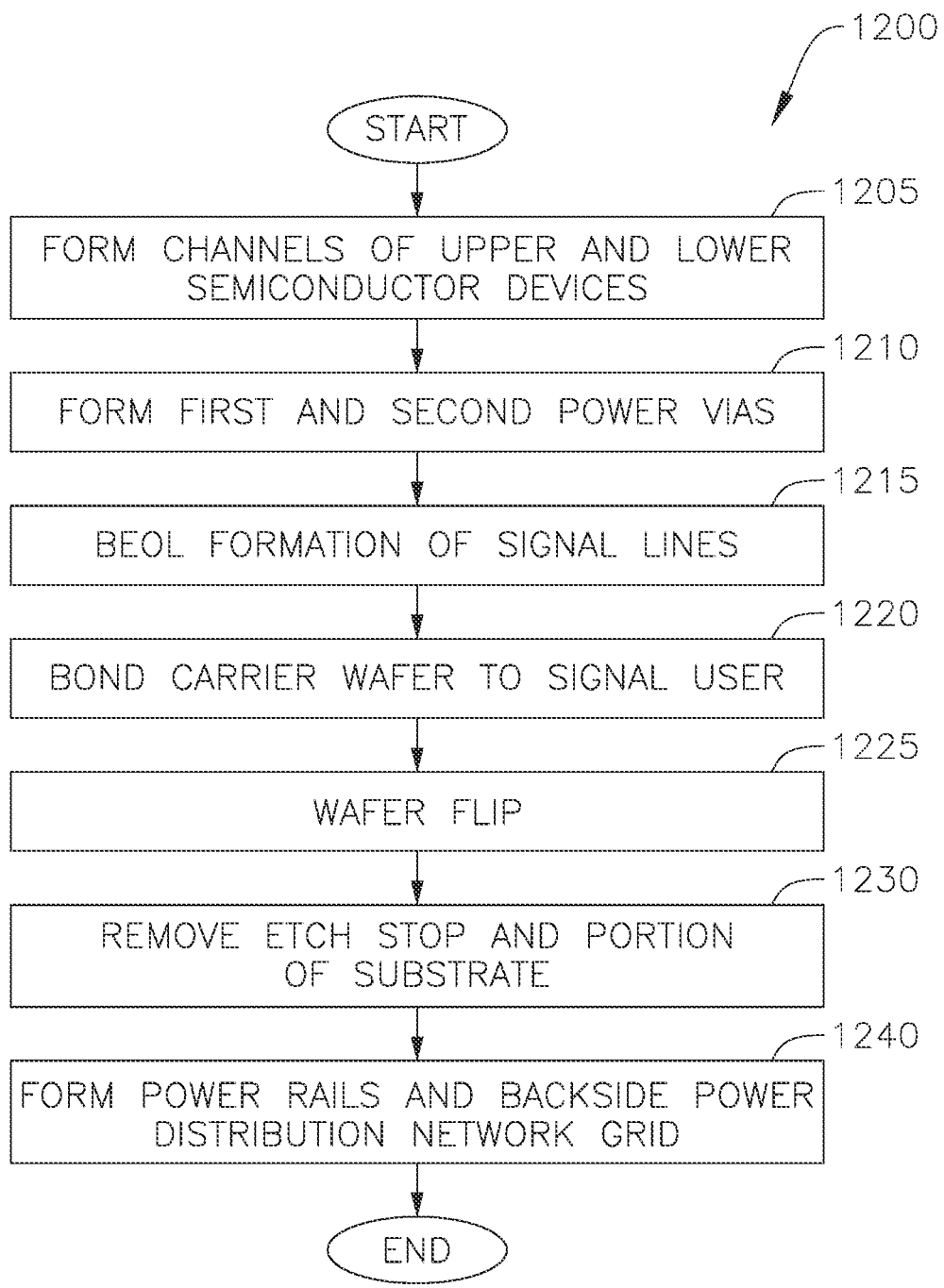

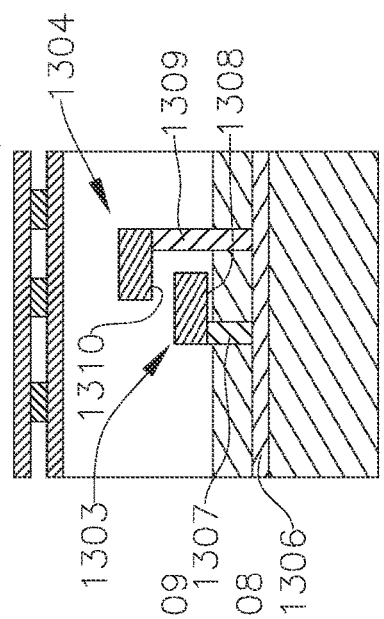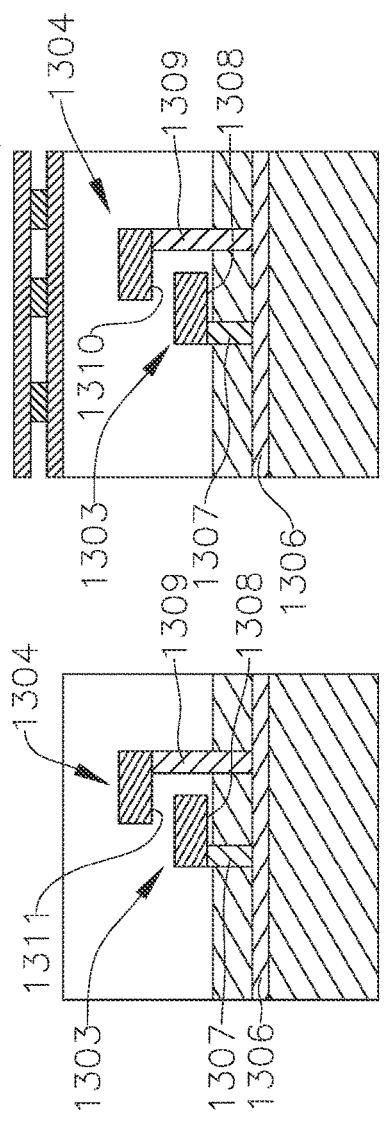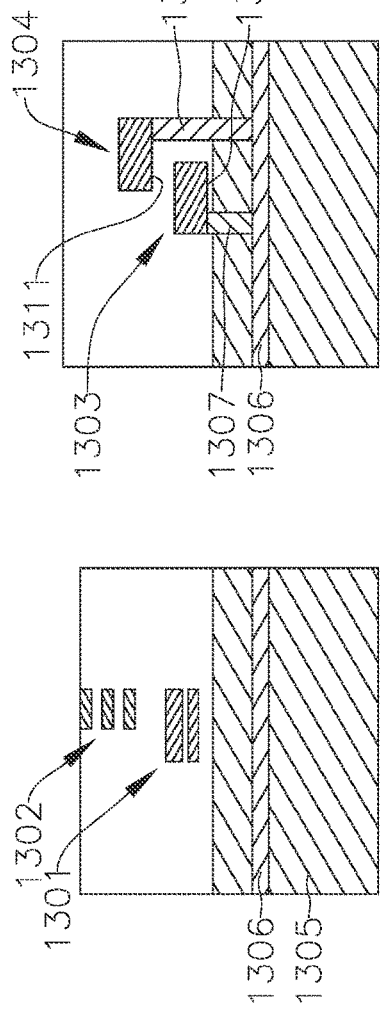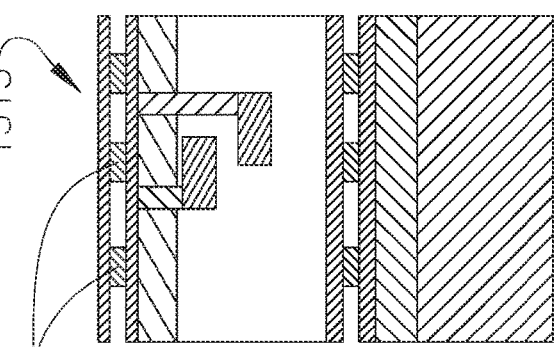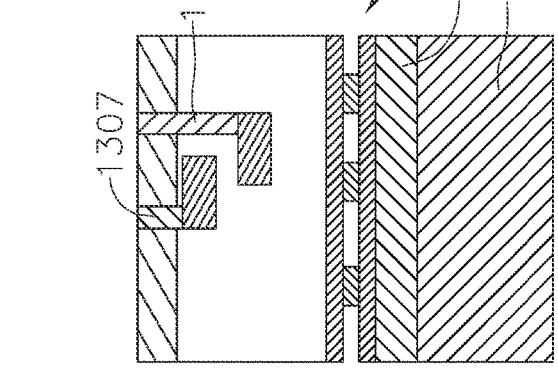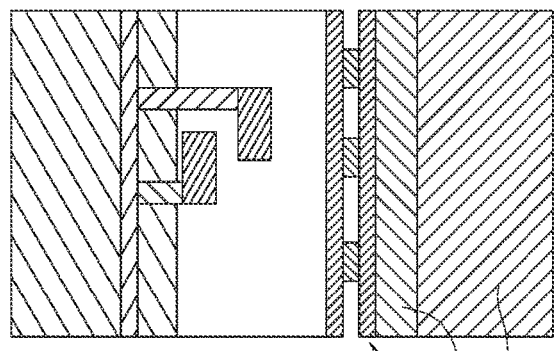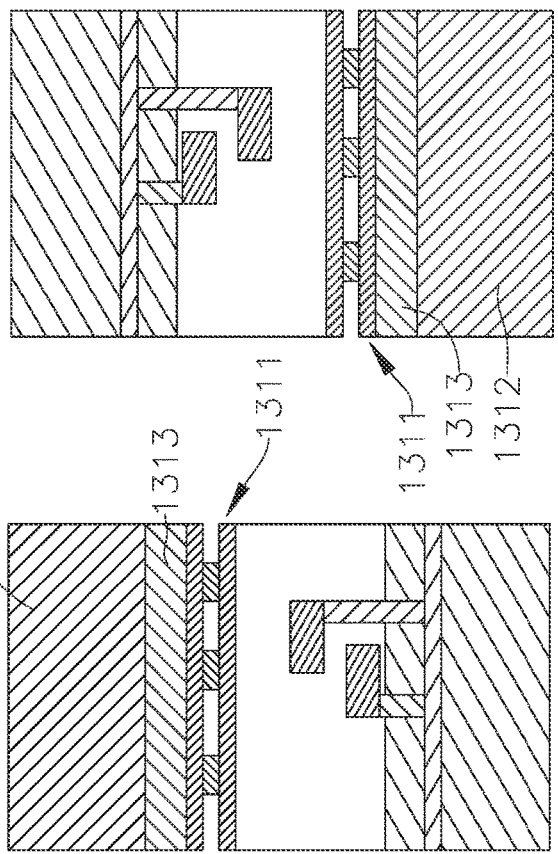

STACKED DEVICE WITH BACKSIDE POWER DISTRIBUTION NETWORK AND METHOD OF MANUFACTURING THE SAME

CROSS-REFERENCE TO RELATED APPLICATION(S)

The present application claims priority to and the benefit of U.S. Provisional Application No. 63/324,558 entitled "Stacked Device with BSPDN Scheme," filed Mar. 28, 2022, the entire content of which is incorporated herein by reference.

BACKGROUND

1. Field

The present disclosure relates to various embodiments of a stacked semiconductor device with a backside power distribution (BSPDN) and methods of manufacturing the same.

2. Description of Related Art

Semiconductor devices have a variety of different configurations. Two types of semiconductor devices include non-stacked device architectures and stacked device architectures. A related art non-stacked device architecture typically includes an NMOS device area, a PMOS device area above the NMOS device area, a middle-of-line (MOL) area between the NMOS device area and the PMOS device area, a power rail area (VDD) above the PMOS device area, and a power rail area (GND) below the NMOS device area. Related art stacked device architecture typically includes a PMOS device stacked above an NMOS device, and each of the PMOS and NMOS devices includes separate voltage source supply (VSS) power rail below the respective device and a VDD power rail above the respective device. Additionally, related art stacked device architecture typically includes a frontside power distribution network (PDN) grid and frontside signal routing lines above the stacked NMOS and PMOS devices. However, providing both the PDN grid and the signal routing lines above the NMOS and PMOS devices causes routing congestion and thereby limits block area scaling.

SUMMARY

The present disclosure relates to various embodiments of a CMOS structure. In one embodiment, the CMOS structure includes a wafer, a first semiconductor device and a second semiconductor device stacked on the first semiconductor device on a front side of the wafer, power rails on a back side of the wafer that are coupled to the first and second semiconductor devices, a backside power distribution network (PDN) grid on the back side of the wafer that is coupled to the power rails; and front-side signal routing lines on the front side of the wafer that are coupled to the first and second semiconductor devices and above the first and second semiconductor devices.

The present disclosure also relates to various embodiments of a method of manufacturing a CMOS device. In one embodiment, the method includes forming channels for a lower semiconductor device and an upper semiconductor device in a bulk material on a silicon substrate including an etch stop, forming a first connection from the lower semiconductor device to the etch stop, forming a second connection from the upper semiconductor device to the etch stop, back-end-of-line forming signal lines coupled to the lower semiconductor device and the upper semiconductor device, bonding a carrier wafer on the signal lines via a bonding interface, performing a wafer flip, removing a portion of the silicon substrate and the etch stop, forming power rails connected to the first connection and the second connection, and forming a backside power distribution network grid coupled to the power rails such that the backside power distribution network grid and the signal lines are on opposite sides of the silicon substrate.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

FIGS. 3A-3H illustrate tasks of the method of manufacturing the embodiments of the stacked semiconductor devices illustrated in FIGS. 1A-1B;

FIG. 4 is a flowchart illustrating tasks of a method of manufacturing the embodiments of the stacked semiconductor devices illustrated in FIG. 1C;

FIGS. 7A-7H illustrate tasks of the method of manufacturing the embodiments of the stacked semiconductor devices illustrated in FIG. 1D;

FIG. 8 is a flowchart illustrating tasks of a method of manufacturing the embodiments of the stacked semiconductor devices illustrated in FIG. 1E; and FIGS. 9A-9G illustrate tasks of the method of manufacturing the embodiments of the stacked semiconductor devices illustrated in FIG. 1E.

DETAILED DESCRIPTION

Figure 1A:
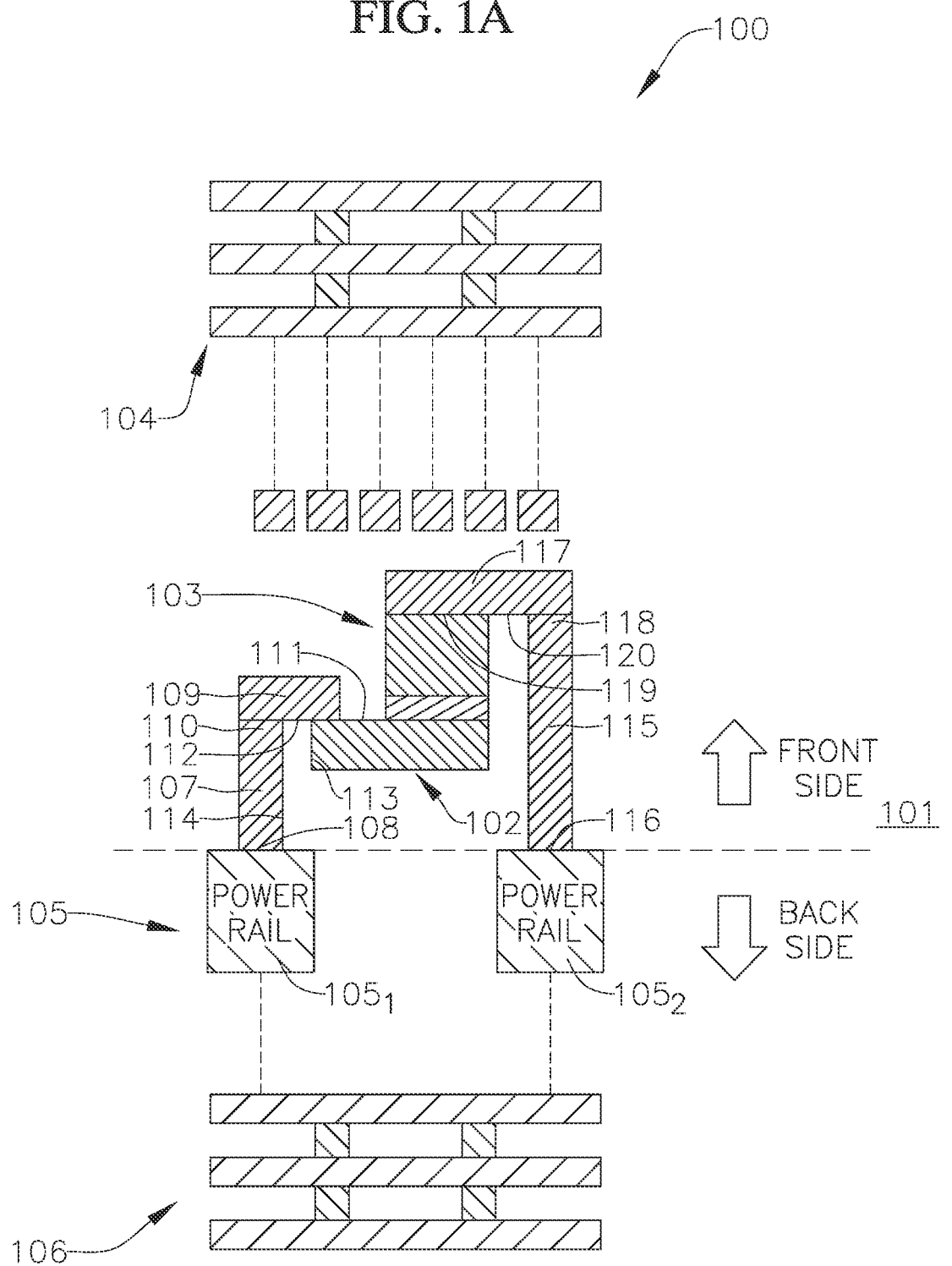
FIGS. 1A-1E are schematic cross-sectional views of a stacked semiconductor device having a backside power distribution network (PDN) grid according to various embodiments of the present disclosure.

The present disclosure relates to various embodiments of a semiconductor device having a stacked architecture, frontside signal routing lines, and a backside power distribution network (PDN) grid. Separating the signal routing lines and the PDN grid on opposite sides of the wafer reduces routing congestion and may improve block level area scaling. Additionally, positioning the PDN grid and the power rails on the backside of the wafer is configured to avoid (or at least mitigate) thermal degradation and contamination issues that might otherwise occur when the power rail is formed before the front-end-of-line (FEOL) process, such as in related art semiconductor devices including a buried power rail and through-silicon vias (TSV) used in a backside PDN grid.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1A, a CMOS structure 100 according to one embodiment of the present disclosure includes a wafer 101, a first semiconductor device 102 (e.g., an NMOS device), a second semiconductor device 103 (e.g., a PMOS device) stacked on the first semiconductor device 102. The first and second semiconductor devices 102 and 103 are located on the frontside of the wafer 101. In the illustrated embodiment, the CMOS structure 100 also includes signal routing lines 104 on the frontside of the wafer 101 that are coupled to the first and second semiconductor devices 102 and 103 to deliver signals to the first and second semiconductor devices 102 and 103. Additionally, in the illustrated embodiment, the CMOS structure 100 also includes backside power rails 105 on the backside of the wafer 101 that are coupled to the first and second semiconductor devices 102 and 103. In the illustrated embodiment, the CMOS structure 100 also includes a backside power distribution network (PDN) grid 106 coupled to the buried power rails 105. Together, the PDN grid 106 and the backside power rails 105 are configured to deliver power to the first and second semiconductor devices 102 and 103.

Accordingly, in the illustrated embodiments, the backside PDN grid 106 and the signal routing lines 104 are separated on opposite sides of the wafer 101, which reduces routing congestion and may improve block level area scaling compared to related art devices that utilize a frontside PDN grid and signal lines above the stacked semiconductor devices. Additionally, providing the backside power rails 105 and the backside PDN grid 106 on the backside of the wafer 101 may prevent (or at least mitigate against) thermal degradation and contamination issues, which might otherwise occur if the power rails are formed before the front-end-of-line (FEOL) process, such as in related art buried power rails and through-silicon vias (TSV) used in a backside PDN grid.

FIGS. 1A-1E depict different schemes or architectures for connecting the power rails to the first and second semiconductor devices. In the embodiment illustrated in FIG. 1A, the first semiconductor device 102 is wider than the second semiconductor device 103 such that a portion of the first semiconductor device 102 is not covered by the second semiconductor device 103. In the illustrated embodiment, the first semiconductor device 102 is partially laterally offset (to the left in FIG. 1A) relative to the second semiconductor device 103 such that a portion of the first semiconductor device 102 is uncovered (relative to the front side) by the second semiconductor device 103. Additionally, in the illustrated embodiment, the CMOS structure 100 includes a first power via 107 having a lower end portion 108 coupled to one of the backside power rails $105_1$, and a first power contact 109 coupled to an upper end 110 of the first power via 107 and to an upper end 111 of the portion of the first semiconductor device 102 that is not covered by the second semiconductor 103. In the illustrated embodiment, the first power via 107 extends vertically up from the power rail $105_1$ such that the upper end 110 of the first power via 107 is level (i.e., co-planar) with the upper end 111 of the first semiconductor device 102, and the first power contact 109 extends horizontally such that a lower end 112 of the first power contact 109 contacts the upper ends 110 and 111 of the first power via 107 and the first semiconductor device 102, respectively. Additionally, in the illustrated embodiment, the first power via 107 is laterally spaced apart from a side portion 113 of the first semiconductor device 102 (e.g., a side 114 of the first power via 107 is spaced apart from the side portion 113 of the first semiconductor device 102).

Additionally, in the embodiment illustrated in FIG. 1A, the CMOS structure 100 includes a second power via 115 having a lower end portion 116 coupled to a second one of the backside power rails $105_2$, and a second power contact 117 coupled to an upper end 118 of the second power via 115 and to an upper end 119 of the second semiconductor device 103. In the illustrated embodiment, the second power via 115 extends vertically up from the power rail $105_2$ such that the upper end 118 of the second power via 115 is level (i.e., co-planar) with the upper end 119 of the second semiconductor device 103, and the second power contact 117 extends horizontally such that a lower surface 120 of the second power contact 117 contacts the upper ends 118 and 119 of the second power via 115 and the second semiconductor device 103, respectively.

Figure 1B:
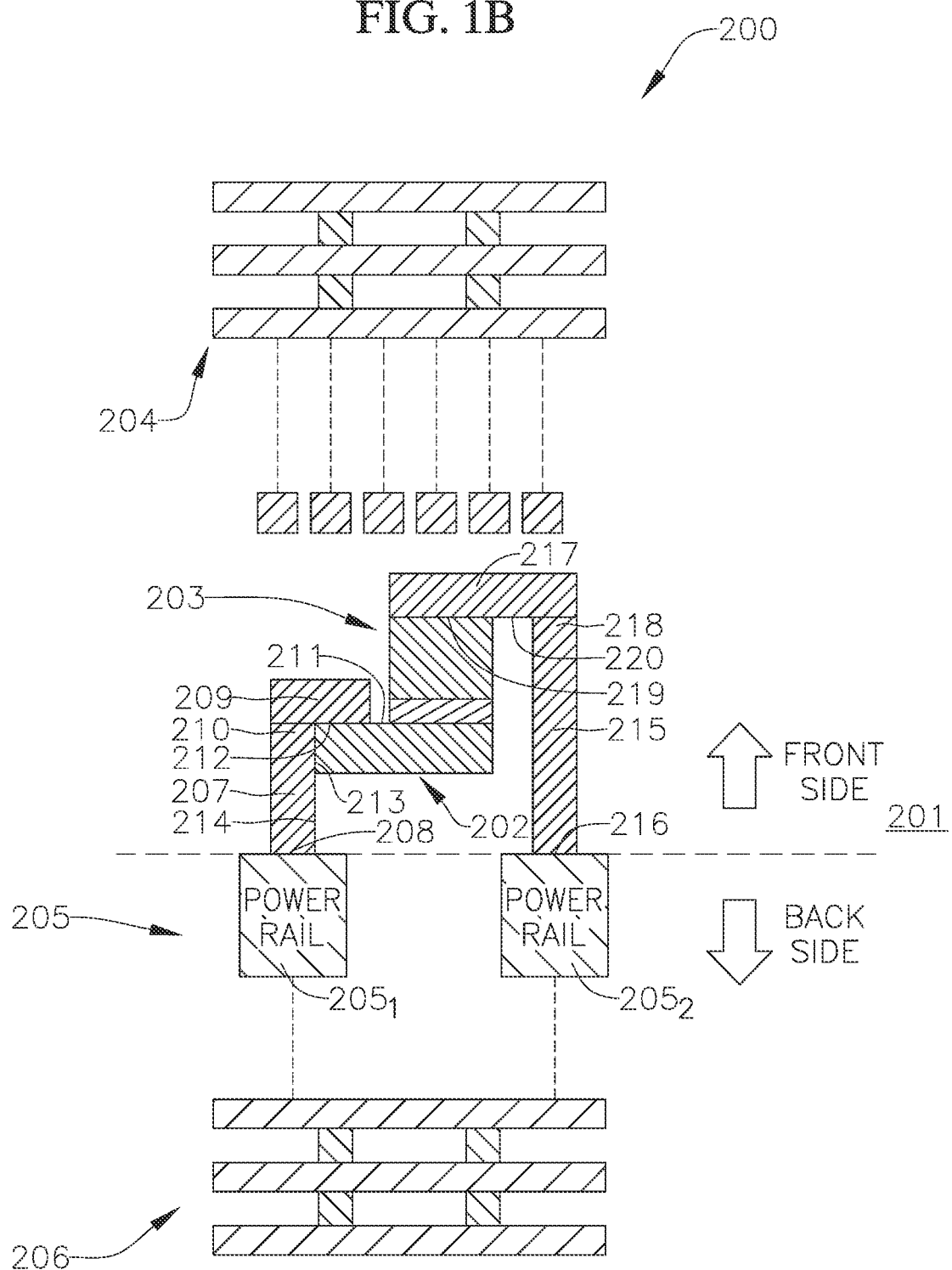

With reference now to FIG. 1B, a CMOS structure 200 according to another embodiment of the present disclosure includes a wafer 201, a first semiconductor device 202 (e.g., an NMOS device), a second semiconductor device 203 (e.g., a PMOS device) stacked on the first semiconductor device 202 on the front side of the wafer 201, signal routing lines 204 on the frontside of the wafer 201 that are coupled to the first and second semiconductor devices 202 and 203, backside power rails 205 on the backside of the wafer 201 that are coupled to the first and second semiconductor devices 202 and 203, and a backside power distribution network (PDN) grid 206 coupled to the backside power rails 205.

Additionally, in the illustrated embodiment, the CMOS structure 200 includes a first power via 207 having a lower end portion 208 coupled to one of the backside power rails $205_1$, and a first power contact 209 coupled to an upper end 210 of the first power via 207 and to an upper end 211 of the portion of the first semiconductor device 202 that is not covered by the second semiconductor 203. In the illustrated embodiment, the first power via 207 extends vertically up from the power rail $205_1$ such that the upper end 210 of the first power via 207 is level (i.e., co-planar) with the upper end 211 of the first semiconductor device 202, and the first power contact 209 extends horizontally such that a lower end 212 of the first power contact 209 contacts the upper ends 210 and 211 of the first power via 207 and the first semiconductor device 202, respectively. In the illustrated embodiment, the first power via 207 is laterally aligned with a side portion 213 of the first semiconductor device 202 (e.g., a side 214 of the first power via 207 contacts the side portion 213 of the first semiconductor device 202).

Additionally, in the embodiment illustrated in FIG. 1B, the CMOS structure 200 includes a second power via 215 having a lower end portion 216 coupled to a second one of the backside power rails $205_2$, and a second power contact 217 coupled to an upper end 218 of the second power via 215 and to an upper end 219 of the second semiconductor device 203. In the illustrated embodiment, the second power via 215 extends vertically up from the power rail $205_2$ such that the upper end 218 of the second power via 215 is level (i.e., co-planar) with the upper end 219 of the second semiconductor device 203, and the second power contact 217 extends horizontally such that a lower surface 220 of the second power contact 217 contacts the upper ends 218 and 219 of the second power via 215 and the second semiconductor device 203, respectively.

Figure 1C:
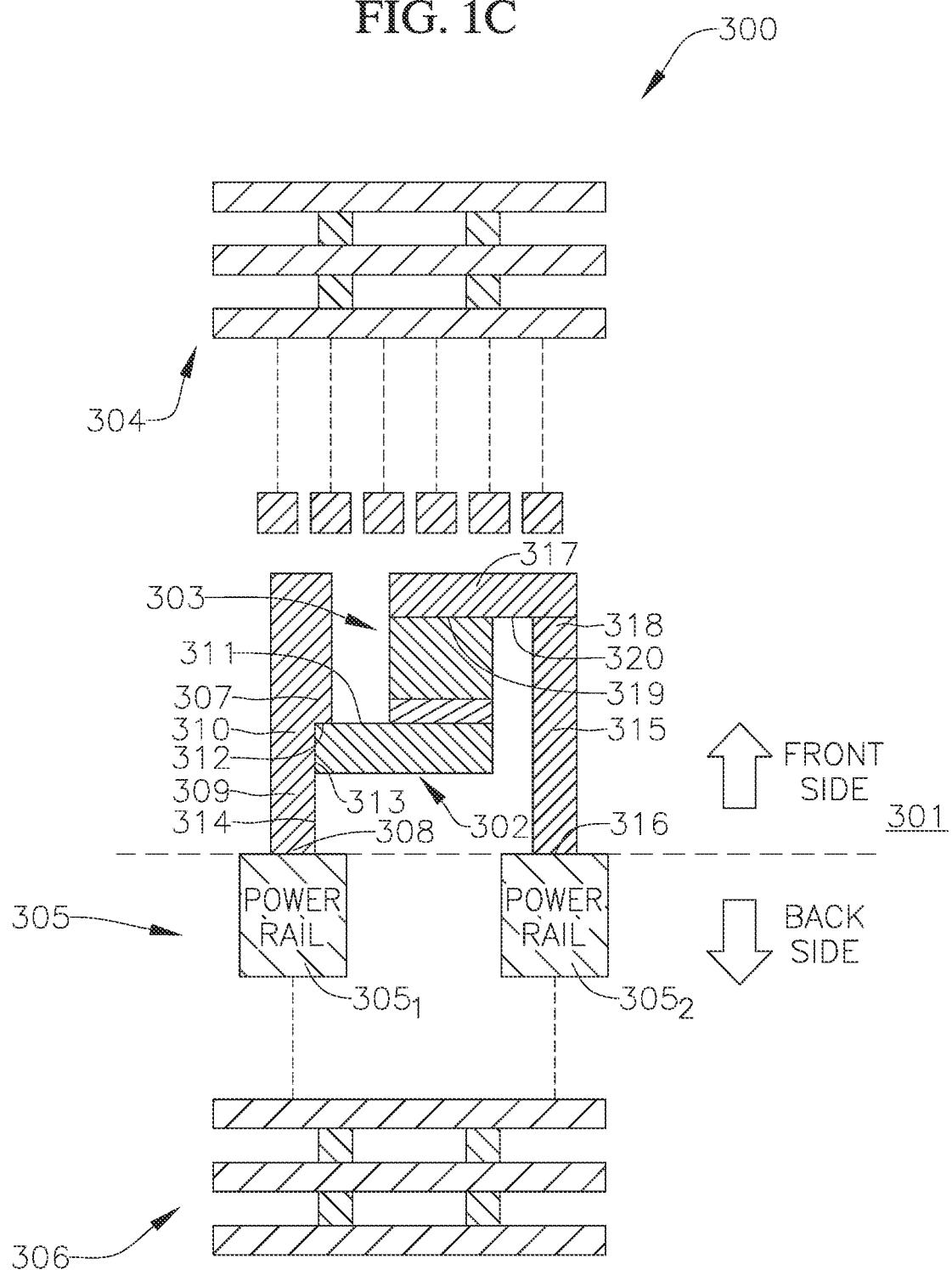

With reference now to FIG. 1C, a CMOS structure 300 according to another embodiment of the present disclosure includes a wafer 301, a first semiconductor device 302 (e.g., an NMOS device), a second semiconductor device 303 (e.g., a PMOS device) stacked on the first semiconductor device 302 on the front side of the wafer 301, signal routing lines 304 on the frontside of the wafer 301 that are coupled to the first and second semiconductor devices 302 and 303, backside power rails 305 on the backside of the wafer 301 that are coupled to the first and second semiconductor devices 302 and 303, and a backside power distribution network (PDN) grid 306 coupled to the backside power rails 305.

Additionally, in the illustrated embodiment, the CMOS structure 300 includes a first power via 307 having a lower end 308 coupled to one of the backside power rails $305_1$ and to the first semiconductor device 302. In the illustrated embodiment, the first power via 307 extends vertically up from the power rail $305_1$. The first power via 307 includes a lower, narrow portion (or segment) 309 below and beside the first semiconductor device 302, and an upper, wider portion (or segment) 310 above the first semiconductor device 302. The wider portion 310 of the first power via 307 extends horizontally toward the first semiconductor device 302 and overhangs the upper end 311 of the portion of the first semiconductor device 302 that is not covered by the second semiconductor 303. A lower surface 312 of the wider portion 310 of the first power via 307 contacts the upper end 311 of the first semiconductor device 302. In the illustrated embodiment, the narrower portion 309 of the first power via 307 is laterally aligned with a side portion 313 of the first semiconductor device 302 (e.g., a side 314 of the narrower portion 309 of the first power via 307 contacts the side portion 313 of the first semiconductor device 302).

Additionally, in the embodiment illustrated in FIG. 1C, the CMOS structure 300 includes a second power via 315 having a lower end portion 316 coupled to a second one of the backside power rails $305_2$, and a second power contact 317 coupled to an upper end 318 of the second power via 315 and to an upper end 319 of the second semiconductor device 303. In the illustrated embodiment, the second power via 315 extends vertically up from the power rail $305_2$ such that the upper end 318 of the second power via 315 is level (i.e., co-planar) with the upper end 319 of the second semiconductor device 303, and the second power contact 317 extends horizontally such that a lower surface 320 of the second power contact 317 contacts the upper ends 318 and 319 of the second power via 315 and the second semiconductor device 303, respectively.

Figure 1D:
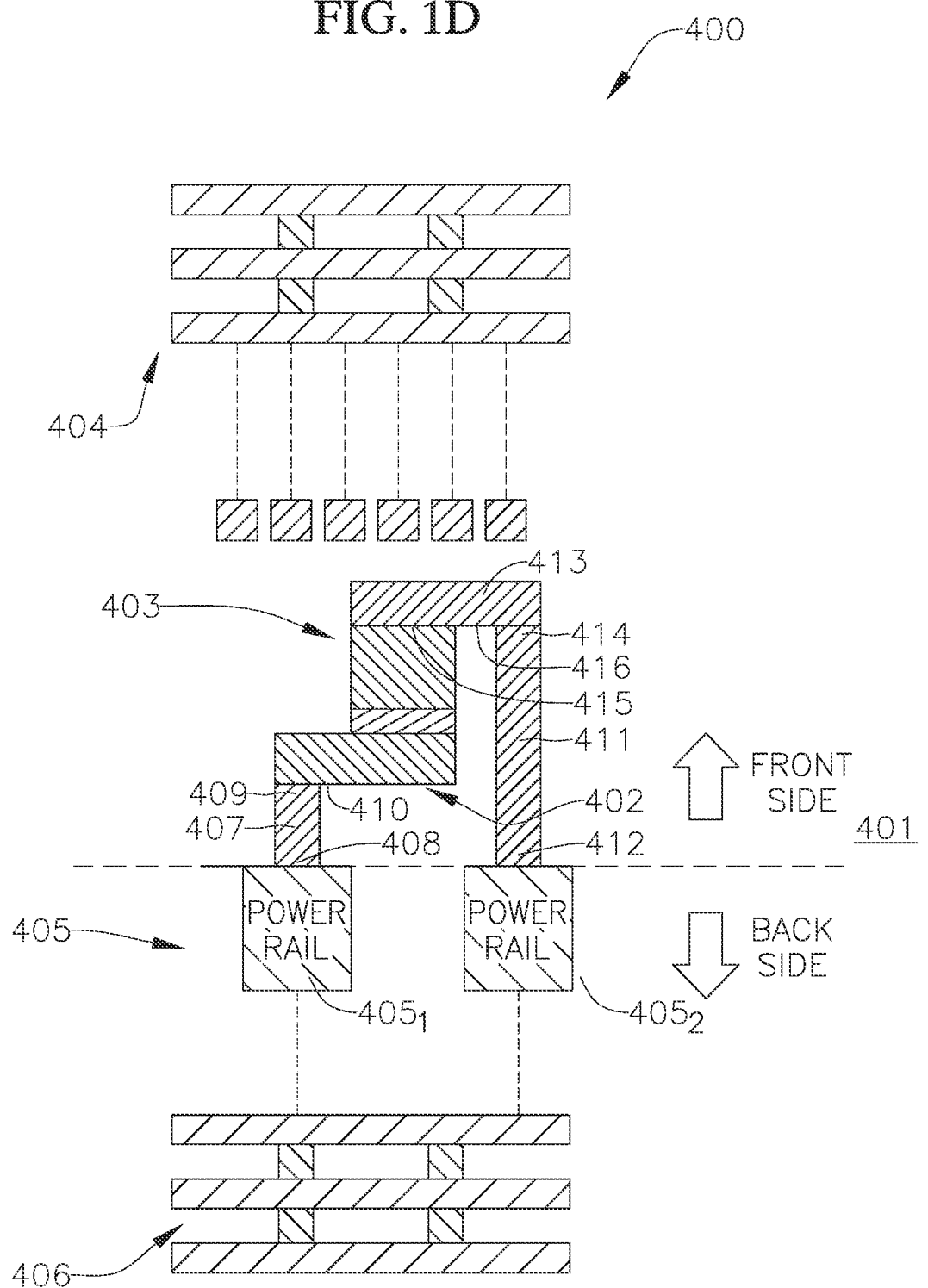

With reference now to FIG. 1D, a CMOS structure 400 according to another embodiment of the present disclosure includes a wafer 401, a first semiconductor device 402 (e.g., an NMOS device), a second semiconductor device 403 (e.g., a PMOS device) stacked on the first semiconductor device 402 on the front side of the wafer 401, signal routing lines 404 on the frontside of the wafer 401 that are coupled to the first and second semiconductor devices 402 and 403, backside power rails 405 on the backside of the wafer 401 that are coupled to the first and second semiconductor devices 402 and 403, and a backside power distribution network (PDN) grid 406 coupled to the backside power rails 405.

Additionally, in the embodiment illustrated in FIG. 1D, the CMOS structure 400 includes a first power via 407 having a lower end 408 coupled to one of the backside power rails $405_1$ and an upper end 409 coupled to the first semiconductor device 402. The first power via 407 extends vertically up from the buried power rail $405_1$ and directly contacts a lower side 410 of the first semiconductor device 402 (i.e., the upper end 409 of the first power via 407 is directly connected to the first semiconductor device 402 without a separate power contact).

Additionally, in the embodiment illustrated in FIG. 1D, the CMOS structure 400 includes a second power via 411 having a lower end portion 412 coupled to a second one of the backside power rails $405_2$, and a power contact 413 coupled to an upper end 414 of the second power via 411 and to an upper end 415 of the second semiconductor device 403. In the illustrated embodiment, the second power via 411 extends vertically up from the power rail $405_2$ such that the upper end 414 of the second power via 411 is level (i.e., co-planar) with the upper end 415 of the second semiconductor device 403, and the power contact 413 extends horizontally such that a lower surface 416 of the power contact 413 contacts the upper ends 414 and 415 of the second power via 411 and the second semiconductor device 403, respectively.

Figure 1E:
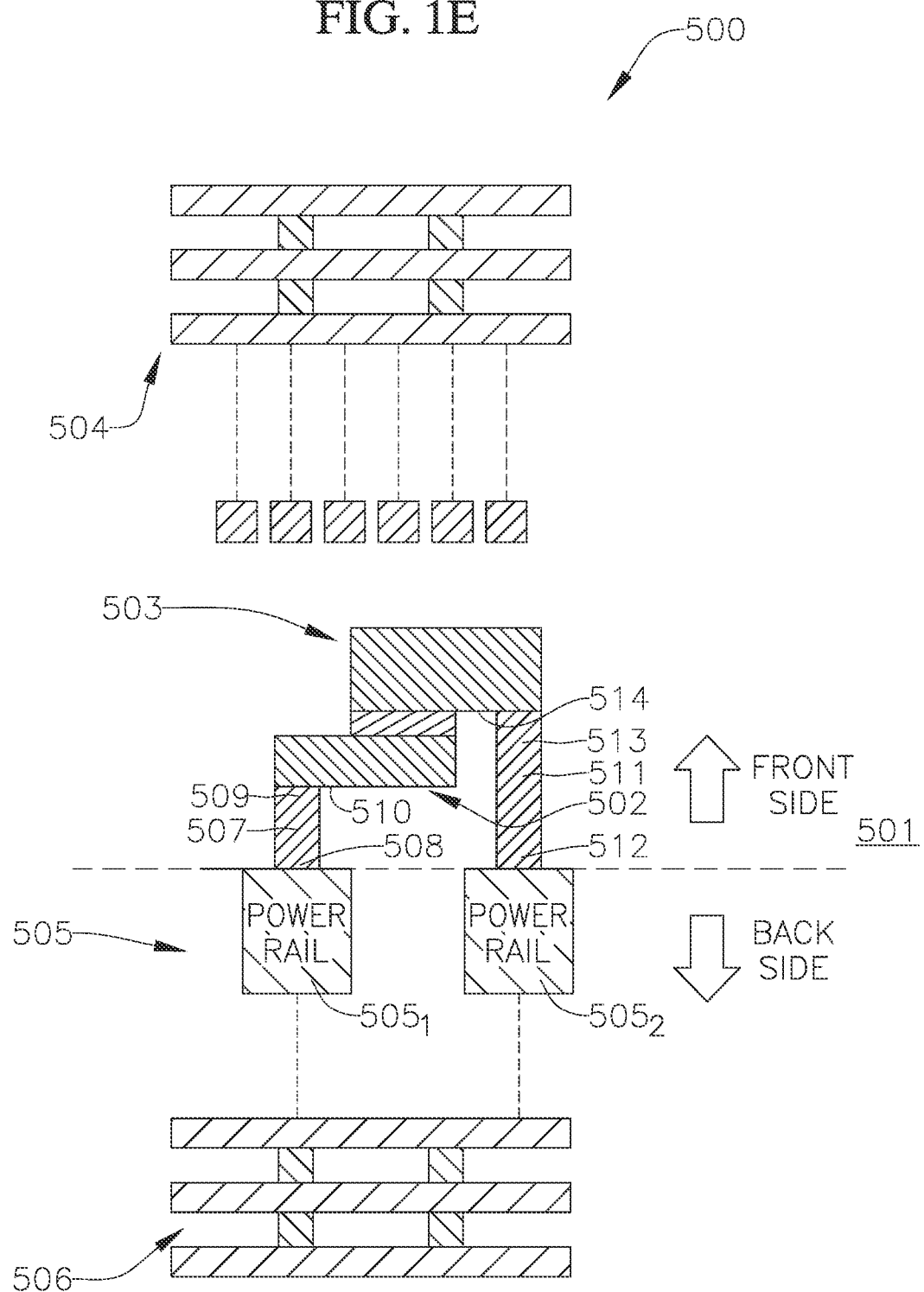

With reference now to FIG. 1E, a CMOS structure 500 according to another embodiment of the present disclosure includes a wafer 501, a first semiconductor device 502 (e.g., an NMOS device), a second semiconductor device 503 (e.g., a PMOS device) stacked on the first semiconductor device 502 on the front side of the wafer 501, signal routing lines 504 on the frontside of the wafer 501 that are coupled to the first and second semiconductor devices 502 and 503, backside power rails 505 on the backside of the wafer 501 that are coupled to the first and second semiconductor devices 502 and 503, and a backside power distribution network (PDN) grid 506 coupled to the backside power rails 505. In the illustrated embodiment, the first semiconductor device 502 extends laterally (to the left in FIG. 1E) beyond the second semiconductor device 503, and the second semiconductor device 503 extends laterally (to the right in FIG. 1E) beyond the first semiconductor device 502 (e.g., the first and second semiconductor devices 502 and 503 are staggered).

Additionally, in the embodiment illustrated in FIG. 1E, the CMOS structure 500 includes a first power via 507 having a lower end 508 coupled to one of the backside power rails $505_1$ and an upper end 509 coupled to the first semiconductor device 502. The first power via 507 extends vertically up from the backside power rail $505_1$ and directly contacts a lower side 510 of the first semiconductor device 502 (i.e., the upper end 509 of the first power via 507 is directly connected to the first semiconductor device 502 without a separate power contact).

Additionally, in the embodiment illustrated in FIG. 1E, the CMOS structure 500 includes a second power via 511 having a lower end 512 coupled to one of the backside power rails $505_2$ and an upper end 513 coupled to the second semiconductor device 503. The second power via 511 extends vertically up from the backside power rail $505_2$ and directly contacts a lower side 514 of the second semiconductor device 503 (i.e., the upper end 513 of the second power via 511 is directly connected to the second semiconductor device 503 without a separate power contact).

Figure 2:
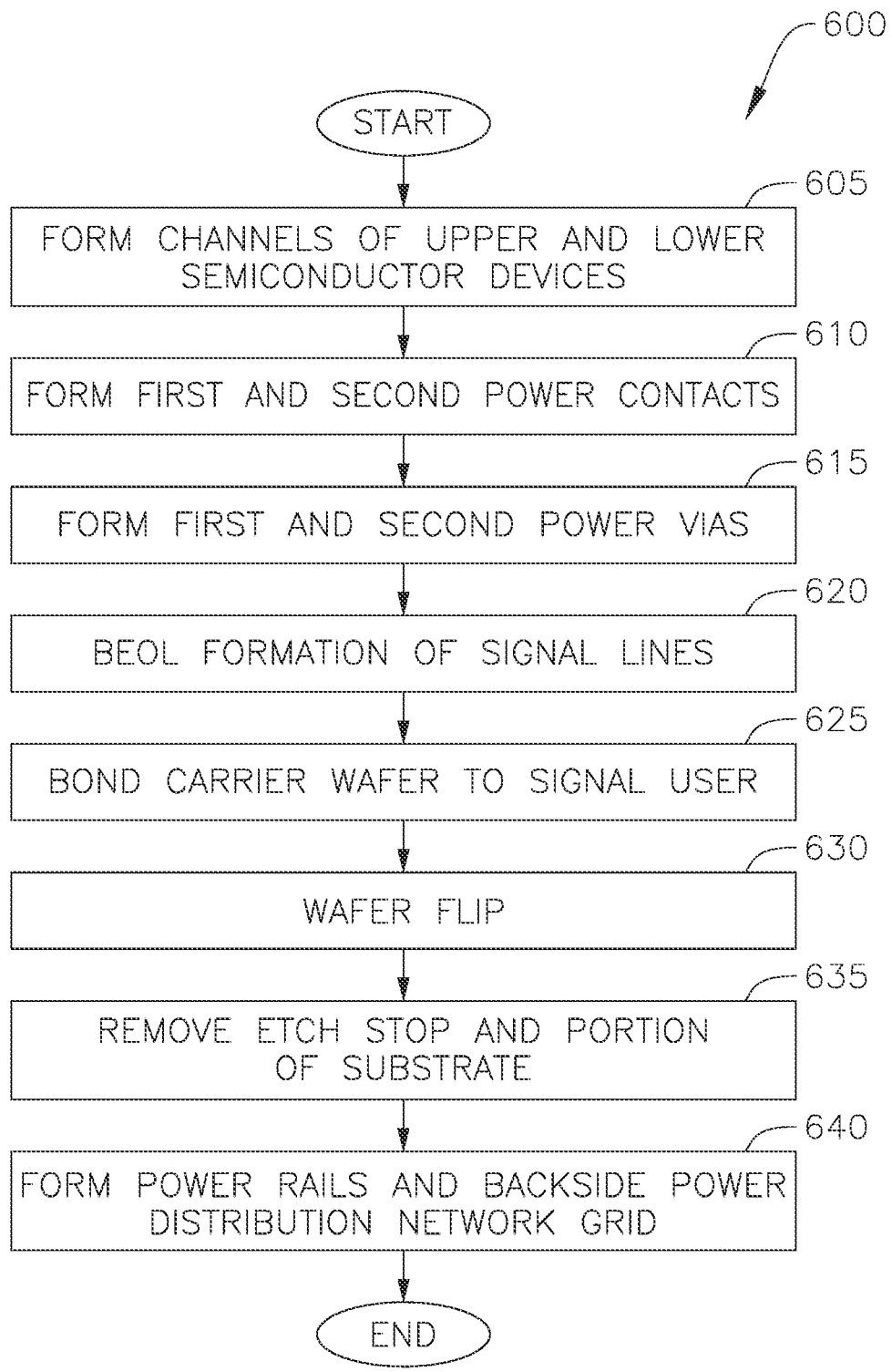
FIG. 2 is a flowchart illustrating tasks of a method of manufacturing the embodiments of the stacked semiconductor devices illustrated in FIGS. 1A-1B.

FIG. 2 is a flowchart depicting tasks of a method 600 of manufacturing the CMOS structures 100 and 200 depicted in FIGS. 1A and 1B, and FIGS. 3A-3H are schematic views of the tasks of manufacturing the CMOS structures 100 and 200. As illustrated in FIGS. 2 and 3A, the method 600 includes a task 605 of forming channels 701 and 702 for a lower semiconductor device 703 (e.g., an nFET) and an upper semiconductor device 704 (e.g., a pFET), respectively, stacked on the lower semiconductor device 703. In the illustrated embodiment, the channels 701 and 702 are formed on a silicon (Si) substrate 705 having an etch stop layer 706 formed therein.

As illustrated in FIGS. 2 and 3B, the method 600 also includes a task 610 of forming remaining portions of the lower semiconductor device 703 and the upper semiconductor device 704 (e.g., patterning contacts on top of the source/drain epitaxy regions). In the illustrated embodiment, the lower semiconductor device 703 is laterally offset (to the left in FIG. 3B) relative to the upper semiconductor device 704 such that a portion of the upper side 707 of the lower semiconductor device 703 is uncovered (or exposed) by the upper semiconductor device 704. In the illustrated embodiment, the task 610 also includes forming a first power contact 708 on (e.g., directly contacting) the exposed portion of the upper side 707 of the lower semiconductor device 703 and a second power contact 709 on (e.g., directly contacting) an upper side 710 of the upper semiconductor device 704. In the illustrated embodiment, the first and second power contacts 708 and 709 formed in task 610 extend horizontally outward away from each other in opposite directions.

As illustrated in FIGS. 2 and 3C, the method 600 also includes a task 615 of forming a first power via 711 extending vertically from the first power contact 708 to the etch stop layer 706, and a second power via 712 extending vertically from the second power contact 709 to the etch stop layer 706.

As illustrated in FIGS. 2 and 3D, the method 600 also includes a task 620 of frontside back-end-of-line (BEOL) formation of signal lines 713.

As illustrated in FIGS. 2 and 3E, the method 600 also includes a task 625 of bonding a second wafer (i.e., a carrier wafer) 714 on the signal lines 713 via a bonding interface 715 (i.e., the task 625 includes performing wafer-to-wafer (W2W) bonding).

As illustrated in FIGS. 2 and 3F-3G, the method 600 also includes a task 630 of performing a wafer flip and then a task 635 of grinding and/or etching to remove the portion of the Si substrate 705 below the etch stop layer 706 and the etch stop layer 706. After the task 635 of removing the portion of the Si substrate 705 below the etch stop layer 706 and the etch stop layer 706, portions of the first and second power vias 711 and 712 are exposed.

As illustrated in FIGS. 2 and 3H, the method 600 also includes a task 640 of forming power rails 716 connected to the exposed portions of the first and second power vias 711 and 712, and a backside power distribution network (BSPDN) grid 717 coupled to the power rails 716. Following the task 640 of forming the power rails 716 and the BSPDN grid 717, the BSPDN 717 and the signal lines 713 are on opposite sides of the stacked semiconductor devices 703 and 704, which reduces routing congestion and may improve block level area scaling compared to related art devices that utilize a frontside PDN grid and signal lines above the stacked semiconductor devices.

Figure 5A:
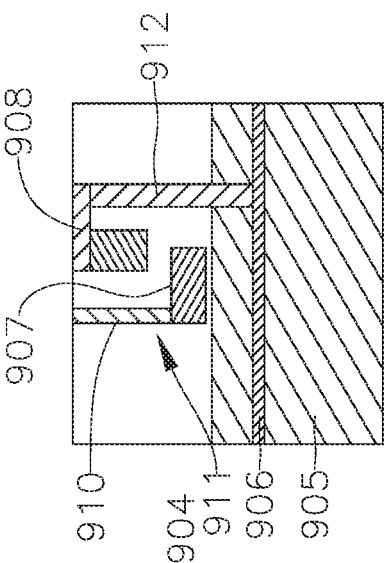
FIGS. 5A-5I illustrate tasks of the method of manufacturing the embodiments of the stacked semiconductor devices illustrated in FIG. 1C.

FIG. 4 is a flowchart depicting tasks of a method 800 of manufacturing the CMOS structure 300 depicted in FIG. 1C, and FIGS. 5A-5I are schematic views of the tasks of manufacturing the CMOS structure 300. As illustrated in FIGS. 4 and 5A, the method 800 includes a task 805 of forming channels 901 and 902 for a lower semiconductor device 903 (e.g., an nFET) and an upper semiconductor device 904 (e.g., a pFET), respectively, stacked on the lower semiconductor device 903. In the illustrated embodiment, the channels 901 and 902 are formed on a silicon (Si) substrate 905 having an etch stop layer 906 formed therein.

Figure 5B:
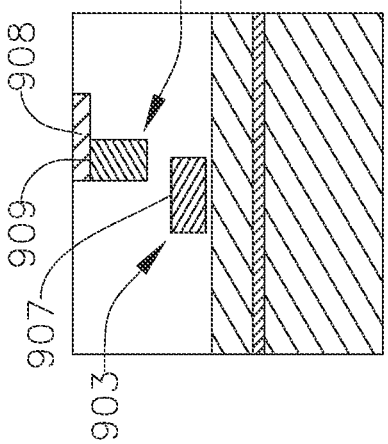

As illustrated in FIGS. 4 and 5B, the method 800 also includes a task 810 of forming remaining portions of the lower semiconductor device 903 and the upper semiconductor device 904. In the illustrated embodiment, the lower semiconductor device 903 is laterally offset (to the left in FIG. 5B) relative to the upper semiconductor device 904 such that a portion of the upper side 907 of the lower semiconductor device 903 is uncovered (or exposed) by the upper semiconductor device 904. In the illustrated embodiment, the task 810 also includes forming a power contact 908 on (e.g., directly contacting) an upper side 909 of the upper semiconductor device 904. In the illustrated embodiment, the power contact 908 formed in task 810 extend horizontally outward away from the upper semiconductor device 904.

Figure 5C:
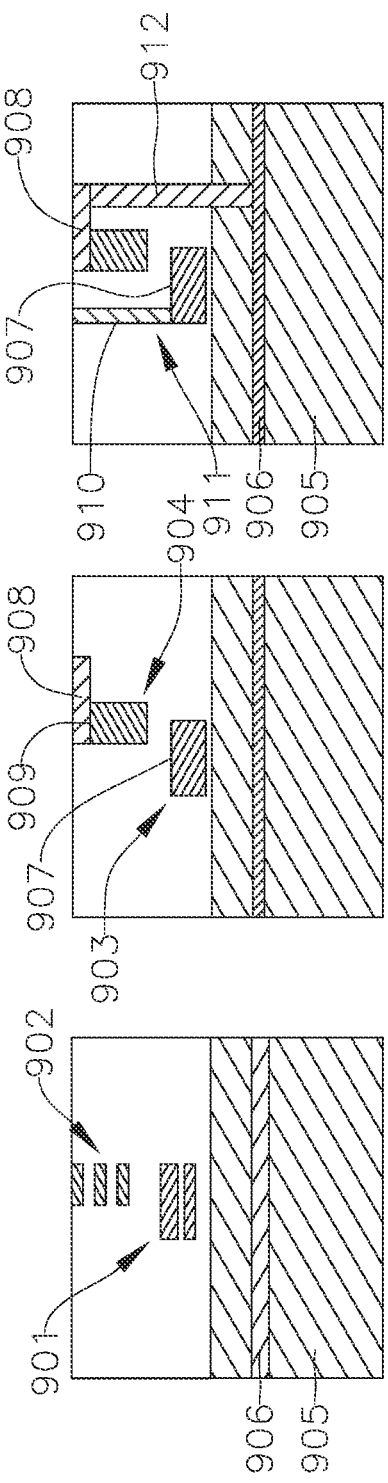

As illustrated in FIGS. 4 and 5C, the method 800 also includes a task 815 of forming a first portion 910 of a first power via 911 extending vertically upward from the exposed portion of the upper side 907 of the lower semiconductor device 904, and a second power via 912 extending vertically downward from the power contact 908 to the etch stop layer 906.

Figure 5D:
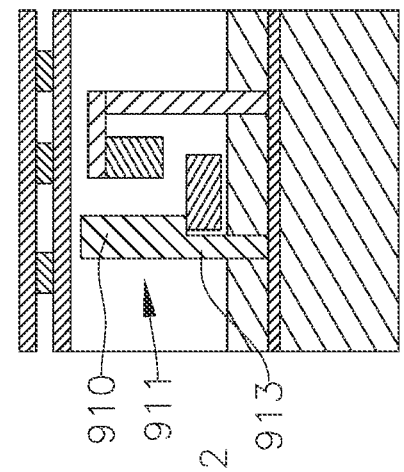

As illustrated in FIGS. 4 and 5D, the method 800 also includes a task 820 of forming a second portion 913 of the first power via 911 extending vertically downward from the first portion 910 of the first power via 911 to the etch stop layer 906. Following the task 820, the first power via 911 includes a lower, narrow portion (or segment) formed by the first portion 910 below the lower semiconductor device 903, and an upper, wider portion (or segment) formed by a combination of the first portion 910 and the second portion 913 above the lower semiconductor device 903. The wider portion of the first power via 911 extends horizontally toward the lower semiconductor device 903 and overhangs the upper side 907 of the portion of the lower semiconductor device 903 that is not covered by the upper semiconductor device 904. A lower surface of the wider portion of the first power via 911 contacts the upper side 907 of the lower semiconductor device 903. Additionally, in the illustrated embodiment, the narrower portion of the first power via 911 is laterally aligned with a side portion of the lower semi-conductor device 903 (e.g., a side of the first power via 911 contacts the side portion of the lower semiconductor device 903).

Figure 5E:
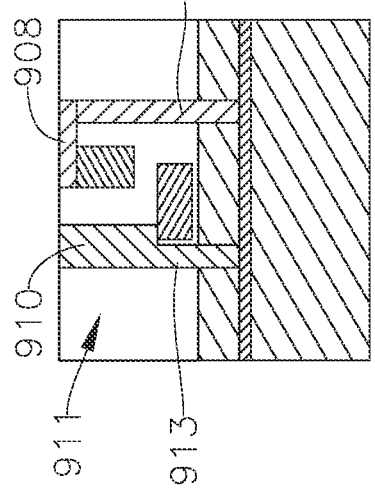

As illustrated in FIGS. 4 and 5E, the method 800 also includes a task 825 of frontside back-end-of-line (BEOL) formation of signal lines 914.

Figure 5F:
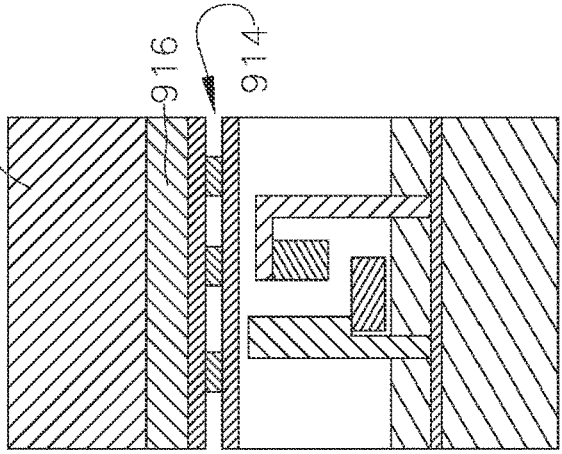

As illustrated in FIGS. 4 and 5F, the method 800 also includes a task 830 of bonding a second wafer (i.e., a carrier wafer) 915 on the signal lines 914 via a bonding interface 916 (i.e., the task 830 includes performing wafer-to-wafer (W2W) bonding).

Figure 5G:
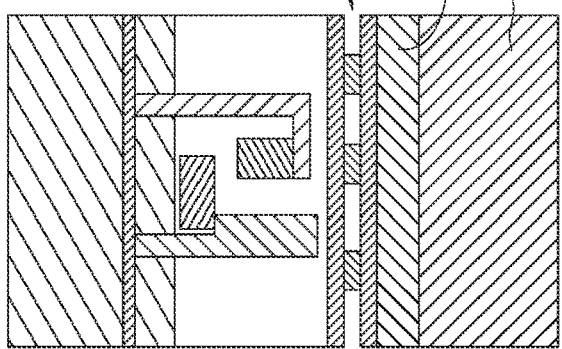
Figure 5H:
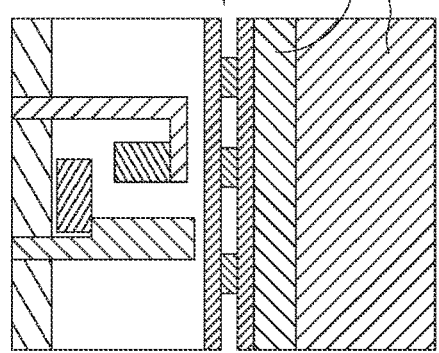

As illustrated in FIGS. 4 and 5G-5H, the method 800 also includes a task 835 of performing a wafer flip and then a task 840 of grinding and/or etching to remove the portion of the Si substrate 905 below the etch stop layer 906 and the etch stop layer 906. After the task 840 of removing the portion of the Si substrate 905 below the etch stop layer 906 and the etch stop layer 906, portions of the first and second power vias 911 and 912 are exposed.

Figure 5I:
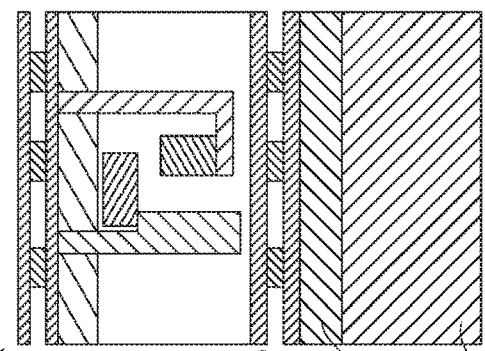

As illustrated in FIGS. 4 and 5I, the method 800 also includes a task 845 of forming power rails 917 connected to the exposed portions of the first and second power vias 911 and 912, and a backside power distribution network (BSPDN) grid 918 coupled to the power rails 917. Following the task 845 of forming the power rails 917 and the BSPDN grid 918, the BSPDN 918 and the signal lines 914 are on opposite sides of the stacked semiconductor devices 904 and 905, which reduces routing congestion and may improve block level area scaling compared to related art devices that utilize a frontside PDN grid and signal lines above the stacked semiconductor devices.

Figure 6:
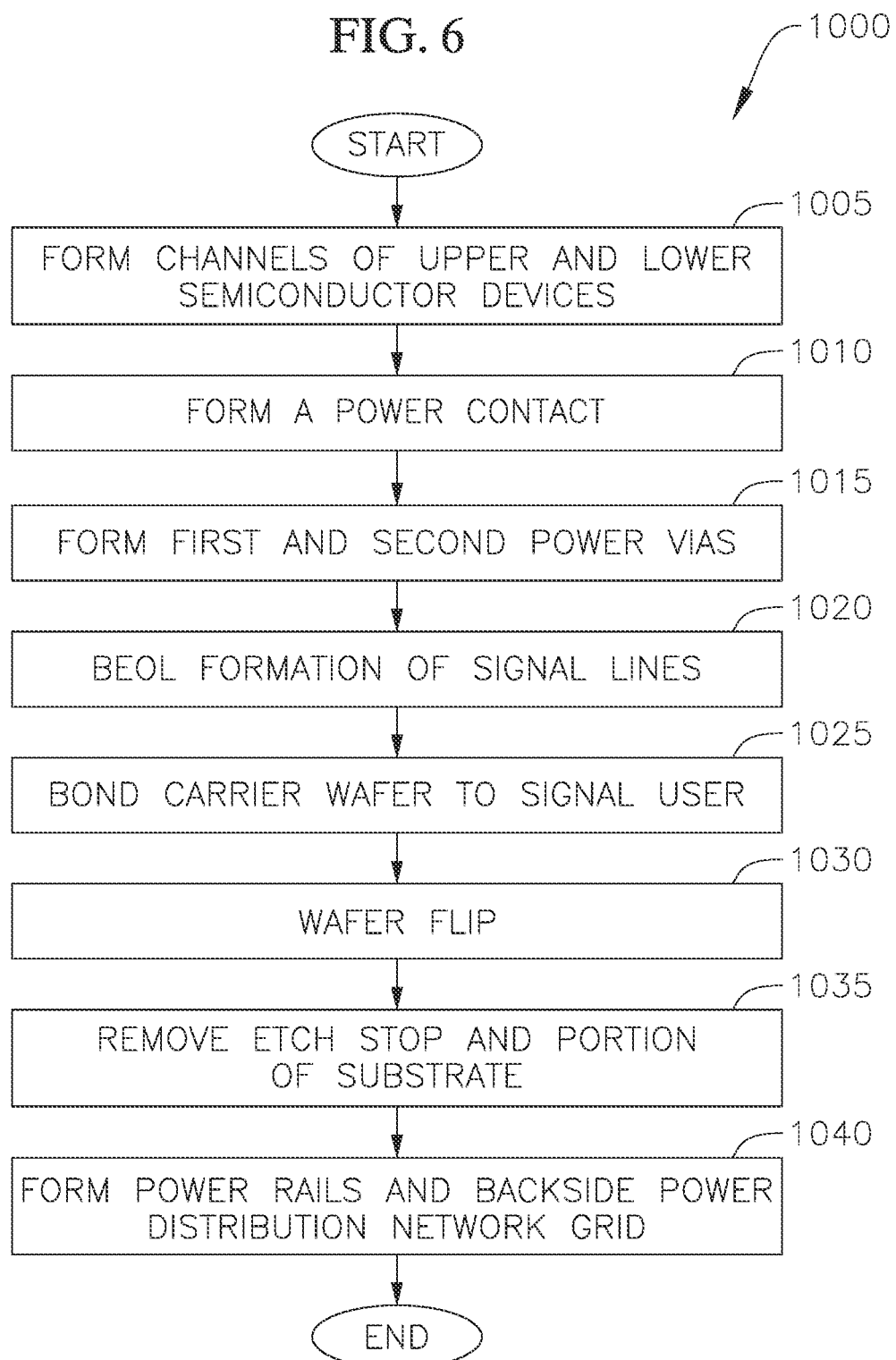
FIG. 6 is a flowchart illustrating tasks of a method of manufacturing the embodiments of the stacked semiconductor devices illustrated in FIG. 1D.

FIG. 6 is a flowchart depicting tasks of a method 1000 of manufacturing the CMOS structure 400 depicted in FIG. 1D, and FIGS. 7A-7H are schematic views of the tasks of manufacturing the CMOS structure 400. As illustrated in FIGS. 6 and 7A, the method 1000 includes a task 1005 of forming channels 1101 and 1102 for a lower semiconductor device 1103 (e.g., an nFET) and an upper semiconductor device 1104 (e.g., a pFET), respectively, stacked on the lower semiconductor device 1103. In the illustrated embodiment, the channels 1101 and 1102 are formed on a silicon (Si) substrate 1105 having an etch stop layer 1106 formed therein.

As illustrated in FIGS. 6 and 7B, the method 1000 also includes a task 1010 of forming remaining portions of the upper semiconductor device 1104 (e.g., contact formation on top of the source/drain epitaxy regions of the upper semi-conductor device 1104). In the illustrated embodiment, the lower semiconductor device 1103 is laterally offset (to the left in FIG. 7B) relative to the upper semiconductor device 1104. In the illustrated embodiment, the task 1010 also includes forming a power contact 1107 on (e.g., directly contacting) an upper side 1108 of the upper semiconductor device 1104. In the illustrated embodiment, the power contact 1107 formed in task 1010 extends horizontally outward away from the upper semiconductor device 1104.

As illustrated in FIGS. 6 and 7C, the method 1000 also includes a task 1015 of forming a first power via 1109 extending vertically downward from a lower side 1110 of the lower semiconductor device 1103 to the etch stop layer 1106, and a second power via 1111 extending vertically downward from the power contact 1107 to the etch stop layer 1106.

As illustrated in FIGS. 6 and 7D, the method 1000 also includes a task 1020 of frontside back-end-of-line (BEOL) formation of signal lines 1112.

As illustrated in FIGS. 6 and 7E, the method 1000 also includes a task 1025 of bonding a second wafer (i.e., a carrier wafer) 1113 on the signal lines 1112 via a bonding interface 1114 (i.e., the task 1025 includes performing wafer-to-wafer (W2W) bonding).

As illustrated in FIGS. 6 and 7F-7G, the method 1000 also includes a task 1030 of performing a wafer flip and then a task 1035 of grinding and/or etching to remove the portion of the Si substrate 1105 below the etch stop layer 1106 and the etch stop layer 1106. After the task 1035 of removing the portion of the Si substrate 1105 below the etch stop layer 1106 and the etch stop layer 1106, portions of the first and second power vias 1109 and 1111 are exposed.

As illustrated in FIGS. 6 and 7H, the method 1000 also includes a task 1040 of forming power rails 1115 connected to the exposed portions of the first and second power vias 1109 and 1111, and a backside power distribution network (BSPDN) grid 1116 coupled to the power rails 1115. Following the task 1040 of forming the power rails 1115 and the BSPDN grid 1116, the BSPDN 1116 and the signal lines 1112 are on opposite sides of the stacked semiconductor devices 1103 and 1104, which reduces routing congestion and may improve block level area scaling compared to related art devices that utilize a frontside PDN grid and signal lines above the stacked semiconductor devices.

FIG. 8 is a flowchart depicting tasks of a method 1200 of manufacturing the CMOS structure 500 depicted in FIG. 1E, and FIGS. 9A-9G are schematic views of the tasks of manufacturing the CMOS structure 500. As illustrated in FIGS. 8 and 9A, the method 1200 includes a task 1205 of forming channels 1301 and 1302 for a lower semiconductor device 1303 (e.g., an nFET) and an upper semiconductor device 1304 (e.g., a pFET), respectively, stacked on the lower semiconductor device 1303. In the illustrated embodiment, the channels 1301 and 1302 are formed on a silicon (Si) substrate 1305 having an etch stop layer 1306 formed therein.

As illustrated in FIGS. 8 and 9B, the method 1200 also includes a task 1210 of forming remaining portions of the lower semiconductor device 1303 and the upper semiconductor device 1304. In the illustrated embodiment, the lower semiconductor device 1303 is laterally offset (to the left in FIG. 9B) relative to the upper semiconductor device 1304. In the illustrated embodiment, the task 1210 also includes forming a first power via 1307 extending vertically downward from a lower side 1308 of the lower semiconductor device 1303 to the etch stop layer 1306, and a second power via 1309 extending vertically downward from a lower side 1310 of the upper semiconductor device 1304 to the etch stop layer 1306.

As illustrated in FIGS. 8 and 9C, the method 1200 also includes a task 1215 of frontside back-end-of-line (BEOL) formation of signal lines 1311.

As illustrated in FIGS. 8 and 9D, the method 1200 also includes a task 1220 of bonding a second wafer (i.e., a carrier wafer) 1312 on the signal lines 1311 via a bonding interface 1313 (i.e., the task 1220 includes performing wafer-to-wafer (W2W) bonding).

As illustrated in FIGS. 8 and 9E-9F, the method 1200 also includes a task 1225 of performing a wafer flip and then a task 1230 of grinding and/or etching to remove the portion of the Si substrate 1305 below the etch stop layer 1306 and the etch stop layer 1306. After the task 1230 of removing the portion of the Si substrate 1305 below the etch stop layer 1306 and the etch stop layer 1306, portions of the first and second power vias 1307 and 1309 are exposed.

As illustrated in FIGS. 8 and 9G, the method 1200 also includes a task 1230 of forming power rails 1314 connected to the exposed portions of the first and second power vias 1307 and 1309, and a backside power distribution network (BSPDN) grid 1315 coupled to the power rails 1314. Following the task 1230 of forming the power rails 1314 and the BSPDN grid 1315, the BSPDN 1315 and the signal lines 1311 are on opposite sides of the stacked semiconductor devices 1303 and 1304, which reduces routing congestion and may improve block level area scaling compared to related art devices that utilize a frontside PDN grid and signal lines above the stacked semiconductor devices.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention. One or more of the features described with reference to one embodiment may be combined with one or more features described with another embodiment to provide a workable stacked semiconductor device. Although various mechanisms and structures have been described above to connect to a bottom transistor and to a top transistor, these mechanisms and structures may be combined in any suitable manner to form a workable stacked semiconductor device.

What is claimed is:

1. A CMOS structure comprising:
 a wafer;
 a first semiconductor device and a second semiconductor device on a front side of the wafer, the second semiconductor device being stacked on the first semiconductor device;
 power rails on a back side of the wafer, the power rails being coupled to the first and second semiconductor devices;
 a backside power distribution network (PDN) grid on the back side of the wafer, the backside PDN grid being coupled to the power rails; and
 front-side signal routing lines on the front side of the wafer, the front-side signal routing lines being coupled to the first and second semiconductor devices and above the first and second semiconductor devices;
 a first power via coupled to the power rails and directly coupled to an upper surface of the first semiconductor device;
 a second power via coupled to the power rails; and
 a power contact coupled to the second power via and to an upper surface of the second semiconductor device,
 wherein the first power via comprises a narrower portion below the first semiconductor device and a wider portion above the first semiconductor device,
 wherein the first semiconductor device and the second semiconductor device are configured to receive power only from the backside PDN grid.

2. The CMOS structure of claim 1, wherein the first power via is adjacent to a side of the first semiconductor device.

3. The CMOS structure of claim 1, wherein the first power via is spaced apart from a side of the first semiconductor device.

4. The CMOS structure of claim 1, wherein the first semiconductor device is laterally offset from the second semiconductor device.

5. A CMOS structure comprising:
- a wafer;
- a first semiconductor device and a second semiconductor device on a front side of the wafer, the second semiconductor device being stacked on the first semiconductor device;
- power rails on a back side of the wafer, the power rails being coupled to the first and second semiconductor devices;
- a backside power distribution network (PDN) grid on the back side of the wafer, the backside PDN being coupled to the power rails;
- front-side signal routing lines on the front side of the wafer, the front-side signal routing lines being coupled to the first and second semiconductor devices and above the first and second semiconductor devices;
- a first power via coupled to the power rails and directly coupled to an upper surface of the first semiconductor device;
- a second power via coupled to the power rails; and
- a power contact coupled to the second power via and to an upper surface of the second semiconductor device,
- wherein the first power via comprises a narrower portion below the first semiconductor device and a wider portion above the first semiconductor device,
- wherein the first semiconductor device is laterally offset from the second semiconductor device, and
- wherein the wider portion of the first power via contacts only a portion of the upper surface of the first semiconductor device that is uncovered by the second semiconductor device.

6. The CMOS structure of claim 5, wherein the first power via contacts a side of the first semiconductor device.

7. The CMOS structure of claim 5, wherein the wider portion of the first power via extends above the first semiconductor device.

* * * * *